US008678563B2

(12) United States Patent
Itayama

(10) Patent No.: US 8,678,563 B2
(45) Date of Patent: Mar. 25, 2014

(54) LIQUID EJECTING HEAD, LIQUID EJECTING APPARATUS, AND PIEZOELECTRIC ELEMENT

(71) Applicant: Seiko Epson Corporation, Tokyo (JP)

(72) Inventor: Yasuhiro Itayama, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 13/690,359

(22) Filed: Nov. 30, 2012

(65) Prior Publication Data

US 2013/0141495 A1    Jun. 6, 2013

(30) Foreign Application Priority Data

Dec. 1, 2011  (JP) ................. 2011-264139

(51) Int. Cl.
*B41J 2/045* (2006.01)
(52) U.S. Cl.
USPC ........................ 347/68; 347/71; 347/72
(58) Field of Classification Search
USPC ............... 347/68, 71, 72; 310/358, 363, 364, 310/313 A, 357; 252/62.9 PZ
See application file for complete search history.

(56) References Cited

U.S. PATENT DOCUMENTS

| | | | |
|---|---|---|---|
| 7,586,234 B2 | 9/2009 | Miyazawa et al. | |
| 2002/0126185 A1* | 9/2002 | Murai | 347/68 |
| 2007/0241642 A1 | 10/2007 | Miyazawa et al. | |
| 2008/0018716 A1 | 1/2008 | Noguchi et al. | |
| 2009/0026887 A1* | 1/2009 | Fujii et al. | 310/330 |
| 2009/0243438 A1 | 10/2009 | Hamada et al. | |
| 2011/0090289 A1 | 4/2011 | Mizukami | |
| 2011/0101828 A1 | 5/2011 | Noda et al. | |
| 2012/0086758 A1 | 4/2012 | Hamada et al. | |
| 2013/0056671 A1 | 3/2013 | Kubota et al. | |

FOREIGN PATENT DOCUMENTS

| | | |
|---|---|---|
| JP | 2001-223404 | 8/2001 |
| JP | 2007-287745 | 11/2007 |
| JP | 2008-028030 | 2/2008 |
| JP | 2009-252790 | 10/2009 |
| JP | 2011-091138 | 5/2011 |
| JP | 2012-018944 | 1/2012 |
| WO | 2009-157189 | 12/2009 |

OTHER PUBLICATIONS

Optimization of PZT Thin Film Crystalline Orientation Through Optimization of TiO2/Pt Templates by Daniel M. Potrepka, Glen R. Fox, and Ronald G. Polcawich dated Jan. 2011.

* cited by examiner

*Primary Examiner* — Henok Legesse
(74) *Attorney, Agent, or Firm* — Harness, Dickey & Pierce, P.L.C.

(57) ABSTRACT

An electrode is provided with a lanthanum nickelate film which is formed through a chemical solution deposition method using a lanthanum nickelate film forming composition which is obtained by heating a mixed solution obtained by mixing at least lanthanum acetate, nickel acetate, acetic acid, and water, a piezoelectric layer is provided on the lanthanum nickelate film and is formed of a complex oxide having a perovskite structure which contains at least Pb, Ti, and Zr, and a half-width ($\theta$) of a peak derived from a (100) plane and/or a peak derived from a (001) plane measured using an X-ray rocking curve method is 6.0 degrees or less.

5 Claims, 9 Drawing Sheets

LIQUID EJECTING HEAD, LIQUID EJECTING APPARATUS, AND PIEZOELECTRIC ELEMENT

The entire disclosure of Japanese Patent Application No. 2011-264139, filed Dec. 1, 2011 is incorporated by reference herein.

BACKGROUND

1. Technical Field

The present invention relates to a liquid ejecting head, a liquid ejecting apparatus, and a piezoelectric element.

2. Related Art

As a liquid ejecting head using a piezoelectric element, for example, there is an ink jet recording head in which an oscillation plate constitutes a part of a pressure generating chamber communicating with nozzle openings which discharge ink droplets, and is deformed by a piezoelectric element to pressurize the ink in the pressure generating chamber to thereby discharge ink droplets from nozzle openings. Two types of ink jet recording heads are commercially available, and one type is an ink jet recording head using a longitudinal oscillation-mode piezoelectric actuator which is expanded or contracted in the axial direction of a piezoelectric element, and the other type is an ink jet recording head using a flexural oscillation-mode piezoelectric actuator. In such actuators, a piezoelectric element capable of obtaining large distortion with a small driving voltage, that is, a piezoelectric element having a large displacement is required for a high-density arrangement.

Therefore, as a piezoelectric material which is used for a piezoelectric layer of the piezoelectric element, for example, a metal oxide having a perovskite structure, such as lead zirconate titanate (PZT), is used (see JP-A-2001-223404 and JP-A-2008-28030).

A piezoelectric element which is provided with a piezoelectric layer made of the piezoelectric material has a high displacement, but when a high voltage is applied, dielectric breakdown may occur in some cases, and thus an improvement in voltage endurance property is required. Such a problem is present not only in liquid ejecting heads represented by ink jet recording heads, but also in other piezoelectric elements.

SUMMARY

An advantage of some aspects of the invention is that it provides a liquid ejecting head having an excellent voltage endurance property, a liquid ejecting apparatus, and a piezoelectric element.

According to an aspect of the invention, there is provided a liquid ejecting head including: a piezoelectric element which is provided with a piezoelectric layer and an electrode provided on the piezoelectric layer, in which the piezoelectric layer is provided above a lanthanum nickelate film, and is formed of a complex oxide having a perovskite structure which contains at least Pb, Ti, and Zr, and a half-width ($\theta$) of a peak derived from a (100) plane and/or a peak derived from a (001) plane measured using an X-ray rocking curve method is 6.0 degrees or less.

In this aspect, it is possible to make a liquid ejecting head which is provided with a piezoelectric element having an excellent voltage endurance property.

According to another aspect of the invention, there is provided a liquid ejecting apparatus including: the liquid ejecting head.

In this aspect, since the piezoelectric element having an excellent voltage endurance property is provided, it is possible to realize a liquid ejecting apparatus having excellent reliability.

According to a further aspect of the invention, there is provided a piezoelectric element including: a piezoelectric layer; and an electrode which is provided on the piezoelectric layer, in which the piezoelectric layer is provided above a lanthanum nickelate film, and is formed of a complex oxide having a perovskite structure which contains at least Pb, Ti, and Zr, and a half-width ($\theta$) of a peak derived from a (100) plane and/or a peak derived from a (001) plane measured using an X-ray rocking curve method is 6.0 degrees or less.

In this aspect, it is possible to make a piezoelectric element having an excellent voltage endurance property.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiment 1

Figure 1:
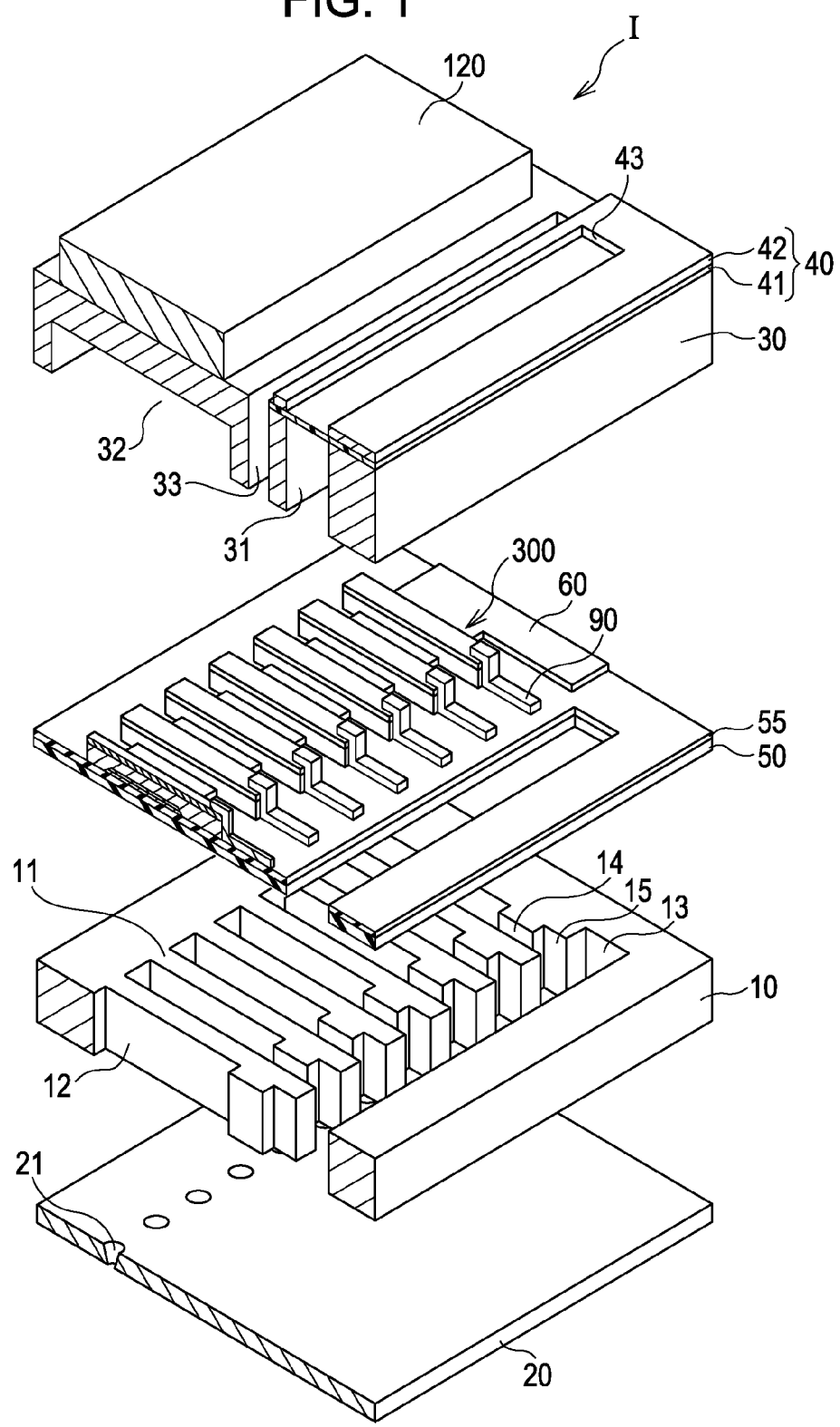
FIG. 1 is an exploded perspective view schematically illustrating the configuration of a recording head according to Embodiment 1.
Figure 2A:
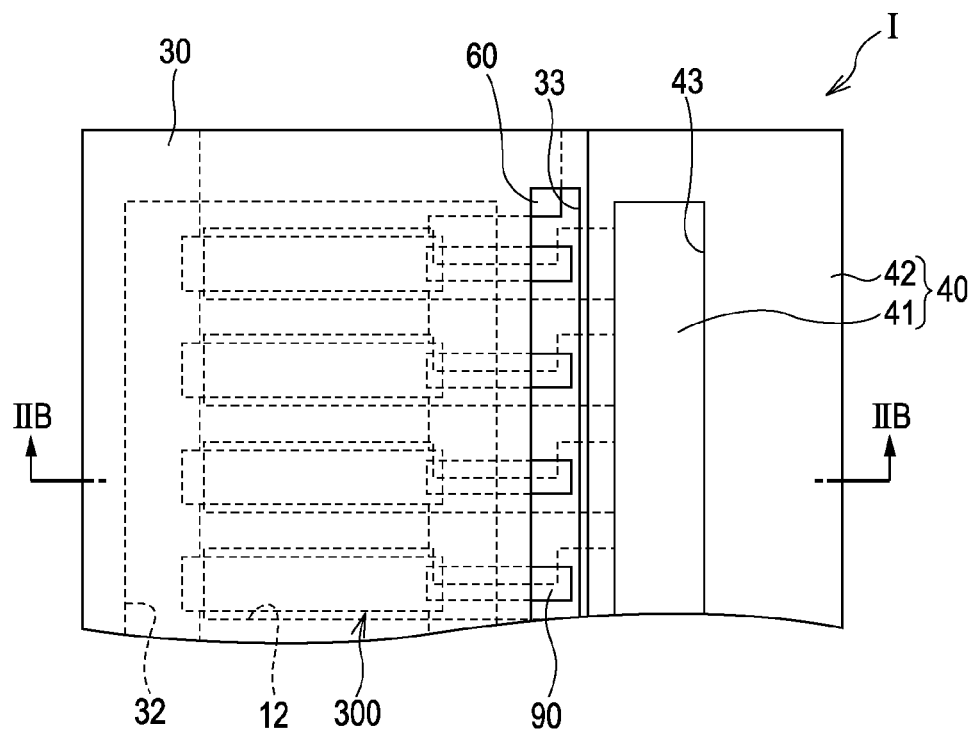
FIGS. 2A and 2B are a plan view and a cross-sectional view, respectively, illustrating the recording head according to Embodiment 1.

FIG. 1 is an exploded perspective view of an ink jet recording head as an example of a liquid ejecting head according to Embodiment 1 of the invention. FIG. 2A is a plan view of FIG. 1 and FIG. 2B is a cross-sectional view, taken along the line IIB-IIB of FIG. 1.

Figure 2B:
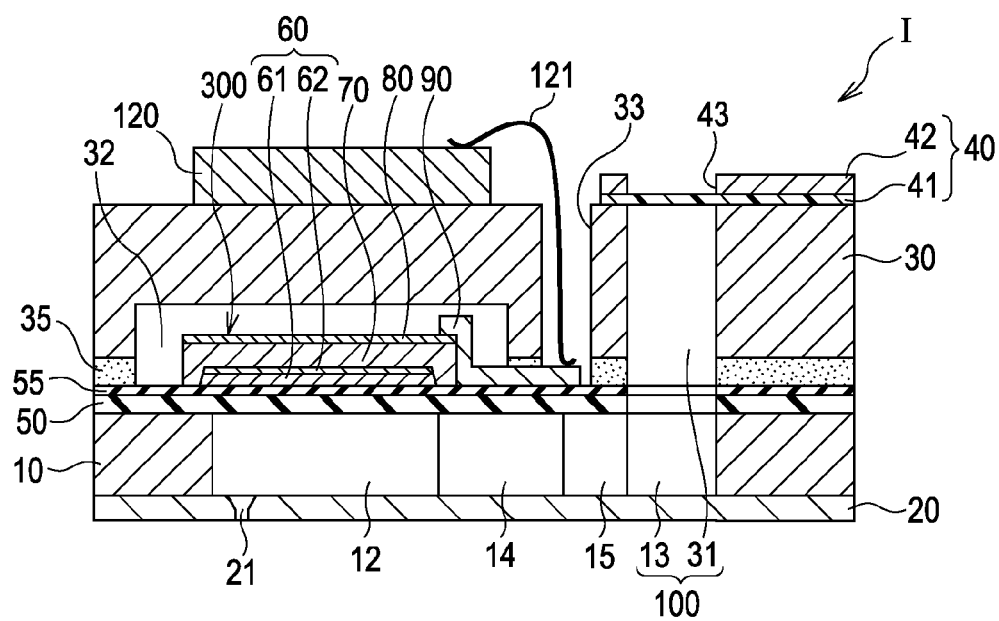

In this embodiment, as shown in FIGS. 1, 2A, and 2B, a flow path forming substrate 10 is formed of a single-crystal silicon substrate of plane orientation (110), and an elastic film 50 having a thickness of 0.5 µm to 2 µm which is made of silicon dioxide and constitutes an oscillation plate is formed on one surface thereof.

In the flow path forming substrate 10, a pressure generating chamber 12 is formed by performing anisotropic etching from one surface side on the opposite side to the other surface. The pressure generating chambers 12 which are partitioned by a plurality of partition walls 11 are arranged in parallel in a direction in which a plurality of nozzle openings 21 discharging the same color ink are arranged in parallel. Hereinafter, the direction will be referred to as the arrangement direction of the pressure generating chambers 12, or the first direction, and a direction perpendicular to the above direction will be referred to as the second direction. In addition, an ink supply path 14 and a communicating path 15 are partitioned from each other by the partition wall 11 at one end portion of the pressure generating chamber 12 of the flow path forming substrate 10 in the second direction. In addition, a communicating portion 13 which constitutes a part of a manifold 100 acting as a common ink chamber (liquid chamber) for the pressure generating chambers 12 is formed at one end of the communicating path 15. That is, the flow path forming substrate 10 is provided with liquid flow paths formed of the pressure generating chambers 12, the ink supply paths 14, the communicating paths 15, and the communicating portion 13.

The ink supply path 14 communicates with one end portion of the pressure generating chamber 12 in the second direction and has a smaller cross-sectional area than the pressure generating chamber 12. For example, in this embodiment, the ink supply path 14 is formed to have a width smaller than that of the pressure generating chamber 12 by narrowing the flow path on the side of the pressure generating chamber 12 in the width direction between the manifold 100 and each pressure generating chamber 12. In this manner, the ink supply path 14 is formed by narrowing the width of the flow path from one side in this embodiment, but the ink supply path may be formed by narrowing the width of the flow path from both sides. In addition, the ink supply path may be formed by narrowing in the thickness direction, not by narrowing the width of the flow path. Furthermore, each communicating path 15 communicates with the ink supply path 14 on the opposite side to the pressure generating chamber 12, and has a larger cross-sectional area than the ink supply path 14 in the width direction (first direction). In this embodiment, the communicating path 15 is formed to have the same cross-sectional area as the pressure generating chamber 12.

That is, in the flow path forming substrate 10, the pressure generating chambers 12, the ink supply paths 14, and the communicating paths 15 are partitioned from each other by the plurality of partition walls 11. In addition, one surface of the pressure generating chamber 12 of the flow path forming substrate 10 is defined by the elastic film 50 which constitutes the oscillation plate.

Meanwhile, a nozzle plate 20 in which the nozzle openings 21 communicating with the vicinity of end portions of the pressure generating chambers 12 on the opposite sides to the ink supply paths 14 are bored is bonded to one surface side of the flow path forming substrate 10 where the liquid flow paths such as the pressure generating chambers 12 are opened via an adhesive, a thermal welding film or the like. The nozzle plate 20 is formed of, for example, glass ceramics, a single-crystal silicon substrate, stainless steel, or the like.

As described above, the elastic film 50 having a thickness of, for example, about 1.0 µm which is made of silicon dioxide is formed on the opposite side to the opening surface of the flow path forming substrate 10, and for example, an insulating film 55 made of zirconium oxide ($ZrO_2$) or the like is laminated and formed on the elastic film 50.

In addition, a first electrode 60, a piezoelectric layer 70, which is a thin film with a thickness of 3 µm or less, and preferably 0.3 µm to 1.5 µm, provided above the first electrode 60, and a second electrode 80 provided above the piezoelectric layer 70 are laminated and formed on the insulating film 55, thereby constituting a piezoelectric element 300. Here, "above" not only includes a meaning of lying immediately on, but also includes a state in which another member is interposed therebetween. The piezoelectric element 300 is a part including the first electrode 60, the piezoelectric layer 70, and the second electrode 80.

Generally, in the piezoelectric element 300, one electrode acts as a common electrode and the other electrode acts as an individual electrode independent therefrom. In this embodiment, the first electrode 60 is provided as an individual electrode of each piezoelectric active portion which is a substantial driving portion of the piezoelectric element 300, and the second electrode 80 is provided as a common electrode common to a plurality of the piezoelectric active portions. Here, a part in which piezoelectric strain occurs due to the application of a voltage to both of the electrodes is the piezoelectric active portion, and a part which continues from the piezoelectric active portion, is not sandwiched between the first electrode 60 and the second electrode 80, and is not driven by voltages is a piezoelectric non-active portion.

In the above-described example, the elastic film 50, the insulating film 55, and the first electrode 60 act as an oscillation plate which is deformed together with the piezoelectric element 300, but the invention is not limited thereto. For example, only the first electrode 60 may act as an oscillation plate without providing the elastic film 50 and the insulating film 55. For example, when only the elastic film 50 acts as an oscillation plate, rigidity is lower than in the case in which the insulating film 55 is provided, and thus the displacement can be increased.

Here, as shown in FIG. 2B, the first electrode 60 of this embodiment is constituted of two layers, for example, a wiring layer 61 made of platinum and a lanthanum nickelate layer (LNO layer) 62 formed on the wiring layer 61.

Such a lanthanum nickelate layer 62 is formed through a chemical solution deposition method using a predetermined lanthanum nickelate layer forming composition, specifically, a lanthanum nickelate layer forming composition which is obtained by heating a mixed solution obtained by mixing at least lanthanum acetate, nickel acetate, acetic acid, and water. Although will be described later in detail, the chemical solution deposition method (CSD method) includes a process of forming a lanthanum nickelate precursor film by applying a lanthanum nickelate film forming composition and a process of performing crystallization by heating the lanthanum nickelate precursor film, thereby forming a lanthanum nickelate film, and examples thereof include a sol-gel method, a MOD method, and the like. The lanthanum nickelate film formed using the lanthanum nickelate film forming composition is preferentially oriented (natural orientation) to a (001) plane or a (100) plane.

Here, the lanthanum nickelate film forming composition according to the invention will be described in detail.

Specifically, first, a mixed solution is obtained by mixing at least lanthanum acetate, nickel acetate, acetic acid, and water (mixed solution preparation process). When the water is not mixed in, the lanthanum acetate and the nickel acetate cannot be dissolved and stability of the mixed solution deteriorates. When the acetic acid is not mixed, wettability with respect to an object is reduced and a lanthanum nickelate film having film uniformity cannot be formed.

In addition, it is preferable that polyethylene glycol (PEG) is added to the mixed solution. When polyethylene glycol (PEG) is added, the lanthanum nickelate film can be formed at lower temperature. Specifically, the heating temperature in a drying process and a degreasing process for the lanthanum nickelate film can be lowered. Accordingly, the temperature margin is increased, and the temperature is easily controlled when forming the lanthanum nickelate film.

The polyethylene glycol (PEG) according to the invention may have a number average molecular weight of, for example, 200 to 2000.

It is preferable that the mixed solution has a polyethylene glycol concentration of 1.5% by mass to 9% by mass. Accordingly, a desired effect can be more securely obtained. When the polyethylene glycol concentration is less than 1.5% by mass, there is concern that the effect may not be sufficiently obtained, and when the polyethylene glycol concentration is greater than 9% by mass, there is concern that a porous lanthanum nickelate film may be formed.

Here, the mixed solution according to the invention is a solution obtained by dissolving lanthanum acetate and nickel acetate in an acetic acid aqueous solution in which acetic acid and water are mixed. The method of preparing the mixed solution is not particularly limited. For example, a predetermined amount of lanthanum acetate and a predetermined amount of nickel acetate are mixed, and then water and acetic acid are added thereto, and thus a mixed solution can be obtained. The method of mixing acetic acid and water is also not particularly limited. Acetic acid may be added and then water may be added, or water may be added and then acetic acid may be added. Otherwise, acetic acid and water may be mixed and added.

In addition, in the mixed solution preparation process, lanthanum acetate and nickel acetate are mixed so that lanthanum (La) and nickel (Ni) are present at a desired molar ratio. Specifically, for example, when a lanthanum nickelate film of $LaNiO_x$ (x=2 to 3) is formed, lanthanum acetate and nickel acetate are mixed so that a molar ratio of lanthanum to nickel is 1:1.

In addition, in the mixed solution preparation process, it is preferable that the mixed solution is prepared so that the molar ratio (acetic acid/water) of acetic acid to water in the mixed solution is, for example, 0.06 to 6.2. This is because, when the molar ratio is in this range, lanthanum acetate and nickel acetate can be easily dissolved in an acetic acid aqueous solution in which acetic acid and water are mixed, and thus a lanthanum nickelate film forming composition can be efficiently manufactured.

In addition, in the mixed solution preparation process, it is preferable that the mixed solution is prepared so that the metal concentration of the mixed solution is 0.5 mol/L or less. When the metal concentration of the mixed solution is 0.5 mol/L or less, a lanthanum nickelate film forming composition more suitable for forming the lanthanum nickelate film can be manufactured. Specifically, for example, a lanthanum nickelate film forming composition having a viscosity suitable for forming the lanthanum nickelate film can be prepared, and the lanthanum nickelate film having a uniform thickness with excellent film uniformity can be easily formed. When the metal concentration is less than 0.1 mol/L, the coefficient of contraction of the lanthanum nickelate precursor film in the degreasing process to be described later is increased, whereby residual stress is easily increased, and thus there is concern that cracks may be caused in the lanthanum nickelate film.

In this embodiment, the mixed solution is obtained by mixing lanthanum acetate, nickel acetate, acetic acid, water, and polyethylene glycol. In such a mixed solution, lanthanum acetate 1.5-hydrate and nickel acetate 4-hydrate are mixed so that the molar ratio of lanthanum to nickel is 1:1, the molar ratio (acetic acid/water) of acetic acid to water is 1.57, the metal concentration is 0.33 mol/L, and the concentration of polyethylene glycol is 1.5%.

Next, the obtained mixed solution is heated (heating process). Accordingly, the reaction proceeds and it is possible to obtain a lanthanum nickelate film forming composition formed of a complex solution containing a predetermined metal complex. In this embodiment, the mixed solution is heated at 70° C. for 1 hour, thereby obtaining the lanthanum nickelate film forming composition.

As described above, the lanthanum nickelate film forming composition according to the invention can be synthesized in the system that includes water. Therefore, it is not necessary to perform synthesis in a special environment such as an $N_2$ atmosphere or an Ar atmosphere to prevent the reaction with water in the air as in manufacturing methods of the related art. In addition, the synthesis can be performed for a short time. Furthermore, since high vacuum is not required, manufacturing is possible with a small device at a low cost.

Returning to FIGS. 2A and 2B, as described above, the crystal orientation plane of the lanthanum nickelate layer 62 is preferentially oriented (natural orientation) to a (001) plane or a (100) plane. Examples of lanthanum nickelate include $LaNiO_3$, $La_3Ni_2O_6$, $LaNiO_2$, $La_2NiO_4$, $La_3Ni_2O_7$, $La_4Ni_3O_{10}$, and the like. In this embodiment, $LaNiO_3$ is used and the preferential orientation is to a (001) plane.

The lanthanum nickelate layer 62 formed through the chemical solution deposition method using the above-described lanthanum nickelate film forming composition functions as an orientation control layer for the piezoelectric layer 70 containing at least Pb, Ti, and Zr, and having a perovskite structure. Using the lanthanum nickelate layer 62, the orientation ratio of the piezoelectric layer 70 can be significantly improved, as compared to the case of an orientation control layer made of, for example, titanium. That is, the lanthanum nickelate layer 62 has significantly high orientation controllability as compared to the case of an orientation control layer made of titanium. Furthermore, the lanthanum nickelate layer 62 can suppress a reduction in the piezoelectric characteristics of the piezoelectric element 300 without being a low-permittivity layer as in the case of titanium. In addition, the lanthanum nickelate layer 62 can significantly improve the orientation ratio of the piezoelectric layer 70 as compared to the case of a lanthanum nickelate layer formed through a sputtering method, or the case of a lanthanum nickelate layer formed through the chemical solution deposition method using another lanthanum nickelate film forming composition.

In addition, in this embodiment, the wiring layer 61 is a platinum layer made of platinum, but the invention is not limited thereto. For example, the wiring layer 61 may have a lamination structure of an iridium oxide layer containing iridium and iridium oxide, a platinum layer, and an iridium oxide layer.

The thickness of the wiring layer 61 is not particularly limited. For example, the thickness may be about 10 nm to 300 nm. The thickness of the lanthanum nickelate layer 62 is also not particularly limited. For example, the thickness may be about 10 nm to 100 nm. In this embodiment, the thickness of the wiring layer 61 is 100 nm, and the thickness of the lanthanum nickelate layer 62 is 40 nm.

In addition, the piezoelectric layer 70 is formed of a complex oxide having a perovskite structure which contains Pb, Ti, and Zr. For example, lead zirconate titanate (PZT) or a relaxor ferroelectric to which a metal such as niobium, nickel, magnesium, bismuth, or yttrium is added is used as the piezoelectric layer 70. The piezoelectric layer 70 of this embodiment is made of lead zirconate titanate (PZT).

It is preferable that the piezoelectric layer 70 is a complex oxide having a perovskite structure, i.e., an $ABO_3$ structure. The A-site of the perovskite structure is coordinated with 12 oxygen atoms, and the B-site is coordinated with 6 oxygen atoms, thereby forming an octahedron.

As described above, when the piezoelectric layer 70 is provided on the lanthanum nickelate layer 62 formed through the chemical solution deposition method using a predetermined lanthanum nickelate film forming composition, it is possible to make the piezoelectric element 300 having an excellent voltage endurance property as described later (see Test Examples, etc.).

In addition, regarding the piezoelectric layer 70, the half-width ($\theta$) of a peak derived from a (100) plane measured using an X-ray rocking curve method is 6.0 degrees or less. This can be realized by forming the piezoelectric layer 70 on the above-described lanthanum nickelate layer 62. That is, when the above-described lanthanum nickelate layer 62 functions as an orientation control layer, the piezoelectric layer 70 is preferentially oriented to the (100) plane and the half-width ($\theta$) of a peak derived from the (100) plane becomes significantly low, that is, 6.0 degrees or less. The numerical value of the half-width ($\theta$) of the peak derived from the (100) plane of the piezoelectric layer 70, which is 6.0 or less, is significantly smaller than in the case of piezoelectric layers in the related art (see Comparative Example 2).

When the lanthanum nickelate layer 62 is not formed through the chemical solution deposition method using the lanthanum nickelate film forming composition which is obtained by heating a mixed solution obtained by mixing at least lanthanum acetate, nickel acetate, acetic acid, and water, for example, when the lanthanum nickelate layer 62 is formed through a sputtering method, or formed through the chemical solution deposition method using another lanthanum nickelate film forming composition, a piezoelectric element 300 having a high voltage endurance property can not be made. In addition, the lanthanum nickelate layer also functions as an orientation control layer, but in this case, the half-width ($\theta$) of a peak derived from the (100) plane of the piezoelectric layer 70 measured using the X-ray rocking curve method is greater than 6.0 degrees.

Here, the half-width ($\theta$) (FWHM: Full Width at Half Maximum) of the peak derived from the (100) plane measured using the X-ray rocking curve method can be obtained by performing Chi-direction scanning using a commercially available X-ray diffractometer. In this embodiment, it is obtained by performing $\theta$-$2\theta$ measurement and rocking curve measurement using D8 Discover With GADDS (manufactured by Bruker AXS) provided with a two-dimensional detector. When the X-ray detector is an X-ray diffractometer provided with a one-dimensional detector, not with a two-dimensional detector, an X-ray source and the one-dimensional detector are fixed and a tilt angle ($\psi$) of a sample is continuously changed to measure a change in intensity, whereby the measurement can be performed in the same manner. At this time, the tilt angle $\psi$ corresponds to $\chi$ of a reciprocal lattice space. Regarding the integration range of the $\theta$-$2\theta$ measurement, for example, $2\theta$ can be set to 20° to 50° and $\psi$_Psi can be set to −85° to −95°, and regarding the integration range of the rocking curve measurement, for example, $2\theta$ can be set to 20.5° to 23° and $\chi$_Kai can be set to −60° to −120°.

Furthermore, it is preferable that the piezoelectric layer 70 has an engineered domain arrangement in which the polarization direction indicating a direction of the polarization moment is tilted at a predetermined angle with respect to a film-surface-vertical direction (the thickness direction of the piezoelectric layer 70, that is, the direction vertical to the surface on which the first electrode 60 or the second electrode 80 is provided). When the polarization direction of the piezoelectric layer 70 is in the engineered domain arrangement, favorable piezoelectric properties for the piezoelectric layer 70 can be obtained.

The piezoelectric element 300 provided with the above described lanthanum nickelate layer 62 and the above described piezoelectric layer 70 has an excellent voltage endurance property. In addition, the piezoelectric layer 70 is provided on the predetermined lanthanum nickelate layer 62, and thus the orientation ratio can be significantly increased.

As the second electrode 80, for example, any of various metals such as Ir, Pt, tungsten (W), tantalum (Ta), and molybdenum (Mo) may be used, and alloys thereof and metal oxides such as iridium oxide may also be used.

The second electrode 80 of each piezoelectric element 300 is connected to a lead electrode 90 made of gold (Au) or the like which protrudes from the vicinity of an end portion on the side of the ink supply path 14 and extends onto the insulating film 55 of the flow path forming substrate 10. A voltage is selectively applied to the respective piezoelectric elements 300 via the lead electrode 90.

A protective substrate 30 having a manifold portion 31 which constitutes at least a part of the manifold 100 is bonded on the flow path forming substrate 10 having the piezoelectric element 300 formed thereon, that is, on the first electrode 60, the elastic film 50, and the lead electrode 90 through an adhesive 35. In this embodiment, the manifold portion 31 is formed to penetrate the protective substrate 30 in the thickness direction over the pressure generating chamber 12 in the width direction, and communicates with the communicating portion 13 of the flow path forming substrate 10 as described above, thereby constituting the manifold 100 which is a common ink chamber for the pressure generating chambers 12.

In addition, a piezoelectric element holding portion 32 which has a space so as not to disturb the operation of the piezoelectric element 300 is provided in an area in the protective substrate 30 which is opposed to the piezoelectric element 300. The piezoelectric element holding portion 32 may have a space so as not to disturb the operation of the piezoelectric element 300, and the space may be sealed or may not be sealed.

It is preferable that a material having substantially the same coefficient of thermal expansion as the flow path forming substrate 10, such as glass or a ceramic material, is used as the protective substrate 30. In this embodiment, the protective substrate 30 is formed using a single-crystal silicon substrate which is the same material as the flow path forming substrate 10.

In addition, the protective substrate 30 is provided with a through hole 33 which penetrates the protective substrate 30 in the thickness direction. The vicinity of an end portion of the lead electrode 90 protruding from each piezoelectric element 300 is provided to be exposed inside the through hole 33.

In addition, a driving circuit 120 for driving the juxtaposed piezoelectric elements 300 is fixed on the protective substrate 30. For example, a circuit board, a semiconductor integrated circuit (IC) or the like can be used as the driving circuit 120. The driving circuit 120 and the lead electrode 90 are electrically connected to each other via a connection wire 121 formed of a conductive wire such as a bonding wire.

In addition, a compliance substrate 40 formed of a sealing film 41 and a fixing plate 42 is bonded on the protective substrate 30. Here, the sealing film 41 is formed of a flexible material having low hardness (for example, a polyphenylene sulfide (PPS) film having a thickness of 6 μm), and one surface of the manifold portion 31 is sealed with the sealing film 41. In addition, the fixing plate 42 is formed of a hard material such as a metal (for example, stainless steel (SUS) having a thickness of 30 μm). In an area in the fixing plate 42 which is opposed to the manifold 100, an opening portion 43 which is completely removed in the thickness direction is formed, and thus one surface of the manifold 100 is sealed only with the flexible sealing film 41.

In an ink jet recording head of this embodiment, ink is introduced from an ink introduction port connected to an exterior ink supplier (not shown) and fills the inside from the manifold 100 to the nozzle openings 21. Then, a voltage is applied between the first electrode 60 and the second electrode 80 corresponding to the pressure generating chamber 12 in accordance with a recording signal from the driving circuit 120, and the elastic film 50, the insulating film 55, the first electrode 60, and the piezoelectric layer 70 are subjected to flexural deformation, thereby increasing the pressure in each pressure generating chambers 12 and discharging ink droplets from the nozzle openings 21.

Next, an example of a method of manufacturing the ink jet recording head of this embodiment will be described with reference to FIGS. 3A to 6C. FIGS. 3A to 6C are cross-sectional views of the pressure generating chamber in the longitudinal direction (second direction).

Figure 3A:
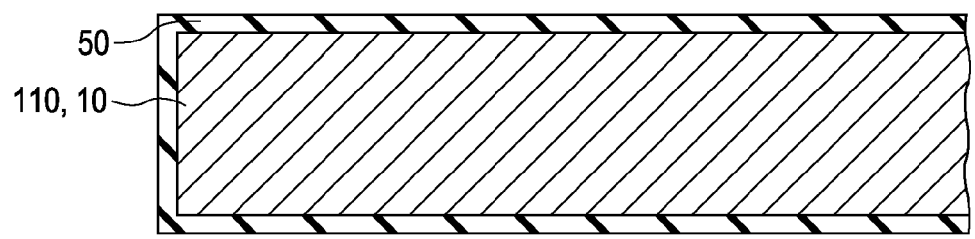
FIGS. 3A and 3B are cross-sectional views illustrating a process of manufacturing the recording head according to Embodiment 1.
Figure 3B:
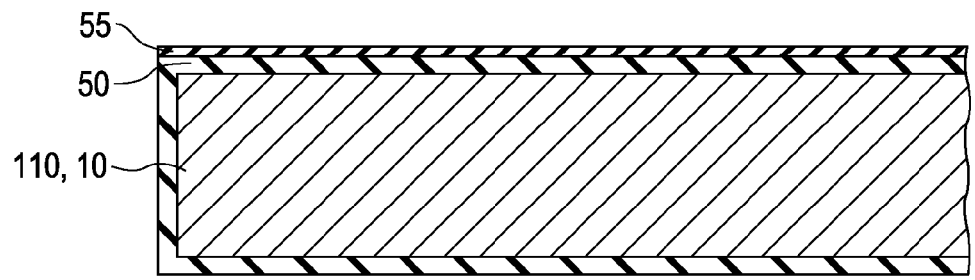

First, as shown in FIG. 3A, a silicon dioxide film made of silicon dioxide ($SiO_2$) or the like which constitutes the elastic film 50 is formed on a surface of a wafer for the flow path forming substrate which is a silicon wafer. Next, as shown in FIG. 3B, the insulating film 55 made of zirconium oxide or the like is formed on the elastic film 50 (silicon dioxide film).

Figure 4A:
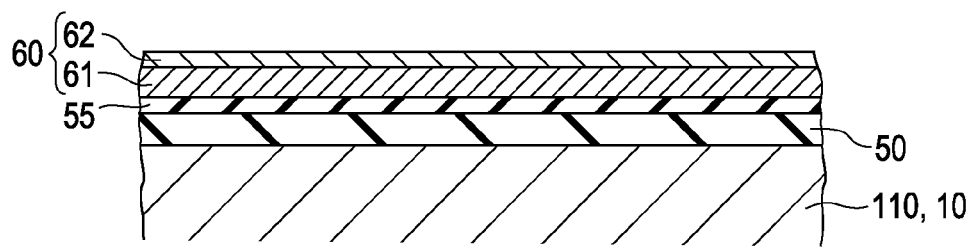
FIGS. 4A to 4C are cross-sectional views illustrating a process of manufacturing the recording head according to Embodiment 1.

Next, as shown in FIG. 4A, the first electrode 60 is formed on the insulating film 55. Specifically, first, the wiring layer 61 is formed using a sputtering method, a laser ablation method, a MOCVD method or the like. Next, the lanthanum nickelate layer 62 is formed by a Chemical Solution Deposition (CSD) method.

Here, the lanthanum nickelate layer 62 is manufactured through a MOD method or a Chemical Solution Deposition (CSD) method such as a sol-gel method using the above-described lanthanum nickelate film forming composition. Specifically, for example, the above-described lanthanum nickelate film forming composition is applied on an object by a spin coating method, a dip coating method, an ink jet method or the like to form a lanthanum nickelate precursor film (application process). Next, the lanthanum nickelate precursor film is heated at a predetermined temperature (for example, 100° C. to 250° C.) and dried for a given time (drying process). Next, the dried lanthanum nickelate precursor film is heated at a predetermined temperature (for example, 300° C. to 500° C.) and held for a given time to be degreased (degreasing process). The "degreasing" mentioned here refers to separating an organic component contained in the lanthanum nickelate precursor film as, for example, $NO_2$, $CO_2$, and $H_2O$. The atmosphere of the drying process or the degreasing process is not limited, and may be air or an inert gas atmosphere.

Next, the lanthanum nickelate precursor film is heated at a predetermined temperature (for example, 500° C. to 800° C.) and held for a given time to be crystallized, thereby forming a lanthanum nickelate film (baking process). The atmosphere of the baking process is also not limited, and may be air or an inert gas atmosphere.

As a heating apparatus which is used in the drying process, the degreasing process, and the baking process, for example, a Rapid Thermal Annealing (RTA) apparatus which performs heating by illumination of an infrared lamp, or a hot plate is used.

Here, using the lanthanum nickelate film forming composition containing polyethylene glycol, the heating temperature in the drying process and the degreasing process can be lowered as compared to the case of a lanthanum nickelate film forming composition not containing polyethylene glycol. That is, when the lanthanum nickelate film forming composition containing polyethylene glycol is used, the temperature margin is increased, and the temperature is easily controlled when forming the lanthanum nickelate film.

The application process, the drying process, and the degreasing process described above, or the application process, the drying process, the degreasing process, and the baking process may be repeated a plurality of times in accordance with a desired thickness and the like to form a plurality of the lanthanum nickelate films.

As described above, when the lanthanum nickelate film forming composition according to the invention is used, the lanthanum nickelate film can be formed by a chemical solution deposition method, and thus the lanthanum nickelate film can be easily manufactured at a low cost with no need for a special environment without problems such as compositional deviation from the oxide used as a target as in the case of a sputtering method and an increase in size of the apparatus for high vacuum. In addition, since the lanthanum nickelate film forming composition is stable, it is not necessary to strictly manage the environment.

Figure 4B:
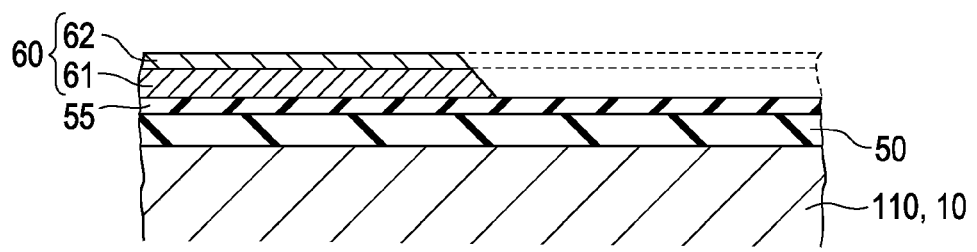

Next, as shown in FIG. 4B, using a resist (not shown) having a predetermined shape as a mask on the first electrode 60, patterning is performed on the first electrode 60 so that a side surface thereof is inclined.

Next, the resist is peeled off, and then the piezoelectric layer 70 is laminated on the first electrode 60 (and the insulating film 55). The method of manufacturing the piezoelectric layer 70 is not particularly limited. However, the piezoelectric layer 70 can be formed using, for example, a so-called sol-gel method including applying and drying a sol in which an organic metal complex is dissolved and dispersed to turn the sol into a gel and baking the gel at high temperature to obtain the piezoelectric layer 70 made of metal oxide. The method of manufacturing the piezoelectric layer 70 is not limited to the sol-gel method, and examples thereof include a liquid phase method such as a Metal-Organic Decomposition (MOD) method, a PVD method, a CVD method, and the like.

Figure 4C:
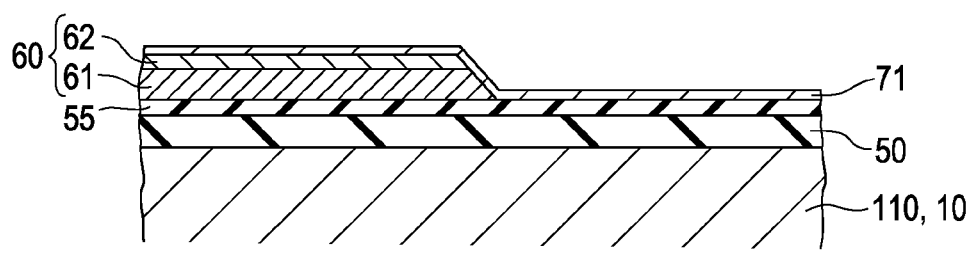

For example, first, as shown in FIG. 4C, a sol or a MOD solution (precursor solution) which includes an organic metal complex containing constituent metals of the piezoelectric material for the piezoelectric layer 70 is applied to the first electrode 60 using a spin coat method or the like to form a piezoelectric precursor film 71 (application process).

The applied precursor solution is, for example, a solution obtained by mixing organic metal complexes respectively containing the constituent metals of the piezoelectric material for the piezoelectric layer 70 so that the constituent metals are present at a desired molar ratio, and by dissolving or dispersing the mixture in an organic solvent such as alcohol. Examples of the organic metal complexes containing the constituent metals of the piezoelectric material include metal alkoxide, organic acid salt, and a β-diketone complex. Specifically, for example, the following substances are used. Examples of the organic metal complex containing lead (Pb) include lead acetate. Examples of the organic metal complex containing zirconium (Zr) include zirconium acetylacetonate, zirconium tetraacetylacetonate, zirconium monoacetylacetonate, and zirconium bisacetylacetonate. Examples of the organic metal complex containing titanium (Ti) include titanium alkoxide and titanium isopropoxide.

Next, the piezoelectric precursor film 71 is heated at a predetermined temperature of about, for example, 130° C. to 180° C. and dried for a given time (drying process). Next, the dried piezoelectric precursor film 71 is heated at a predetermined temperature of, for example, 300° C. to 400° C. and held for a given time to be degreased (degreasing process). The "degreasing" mentioned here refers to separating an organic component contained in the piezoelectric precursor film 71 as, for example, $NO_2$, $CO_2$, and $H_2O$.

Figure 5A:
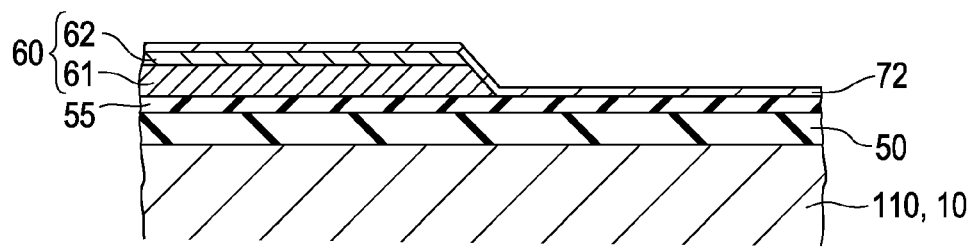
FIGS. 5A and 5B are cross-sectional views illustrating a process of manufacturing the recording head according to Embodiment 1.

Next, as shown in FIG. 5A, the piezoelectric precursor film 71 is heated at a predetermined temperature of about, for example, 650° C. to 800° C. and held for a given time to be crystallized, thereby forming a piezoelectric film 72 (baking process). As a heating apparatus which is used in the drying process, the degreasing process, and the baking process, for example, a Rapid Thermal Annealing (RTA) apparatus which performs heating by illumination of an infrared lamp, or a hot plate is used.

The application process, the drying process, and the degreasing process described above, or the application process, the drying process, the degreasing process, and the baking process may be repeated a plurality of times in accordance with a desired thickness and the like to form the piezoelectric layer formed of a plurality of the piezoelectric films 72.

Figure 5B:
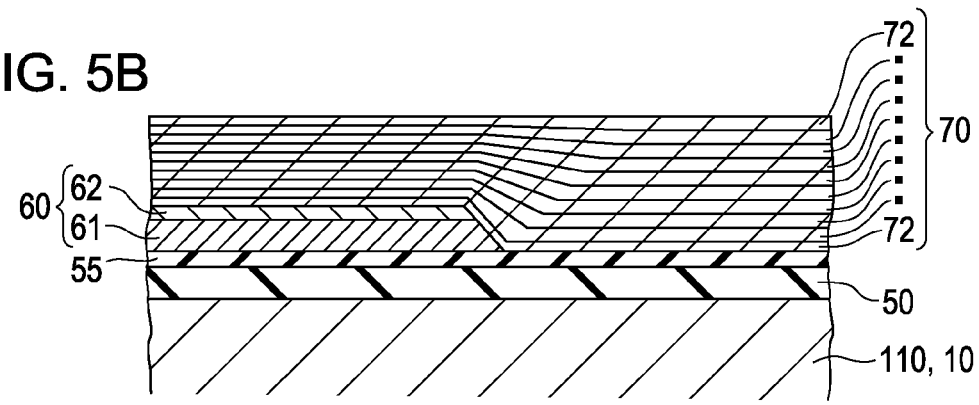

Next, the piezoelectric layer 70 having a predetermined thickness which is formed of a plurality of the piezoelectric films 72 is formed as shown in FIG. 5B by repeating the application process, the drying process, and the degreasing process described above, or the application process, the drying process, the degreasing process, and the baking process a plurality of times in accordance with a desired thickness and the like. For example, when a thickness per single application of the solution is about 0.1 μm, the total thickness of the piezoelectric layer 70 formed of 10 piezoelectric films 72 is about 1.1 μm. In this embodiment, the piezoelectric layer 70 is provided by laminating the piezoelectric films 72, but may be a single layer.

As described above, when the piezoelectric layer 70 is formed on the lanthanum nickelate layer 62 formed through the chemical solution deposition method using a predetermined lanthanum nickelate film forming composition, the lanthanum nickelate layer 62 functions as an orientation control layer for the piezoelectric layer 70, and it is possible to make the piezoelectric layer 70 in which the half-width (θ) of a peak derived from the (100) plane measured using the X-ray rocking curve method is 6.0 degrees or less.

Figure 6A:
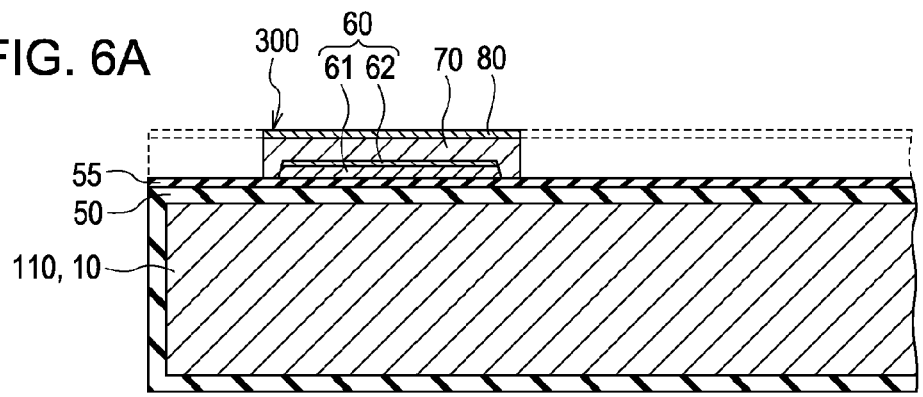
FIGS. 6A to 6C are cross-sectional views illustrating a process of manufacturing the recording head according to Embodiment 1.

After forming the piezoelectric layer 70, as shown in FIG. 6A, the second electrode 80 made of a metal, for example, platinum or the like is laminated on the piezoelectric layer 70, and patterning is performed on the piezoelectric layer 70 and the second electrode 80 at the same time, thereby forming the piezoelectric element 300. The patterning of the piezoelectric layer 70 and the second electrode 80 can be collectively performed by performing dry etching via a resist (not shown) formed into a predetermined shape. Thereafter, postannealing may be performed in a temperature range of 600° C. to 800° C. as necessary. Accordingly, a favorable interface can be formed between the piezoelectric layer 70 and the first electrode 60 or the second electrode 80, and crystalline properties of the piezoelectric layer 70 can be improved.

Figure 6B:
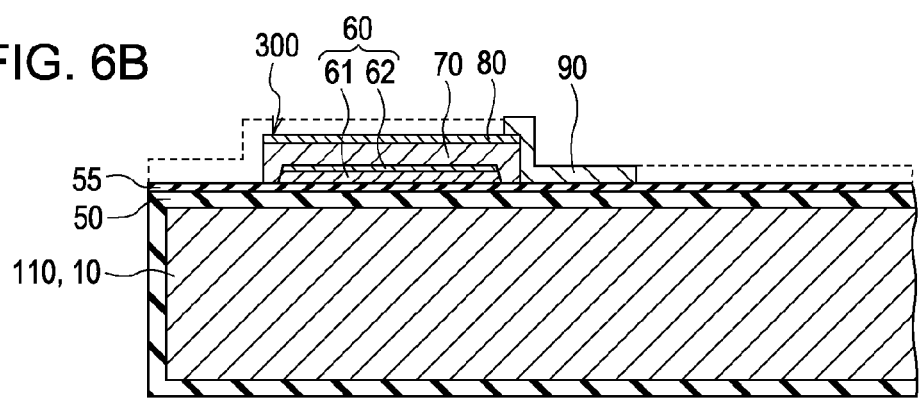

Next, as shown in FIG. 6B, the lead electrode 90 made of, for example, gold (Au) is formed over the entire surface of a wafer 110 for the flow path forming substrate, and thereafter, patterning is performed on each piezoelectric element 300 via, for example, a mask pattern (not shown) formed of a resist or the like.

Figure 6C:
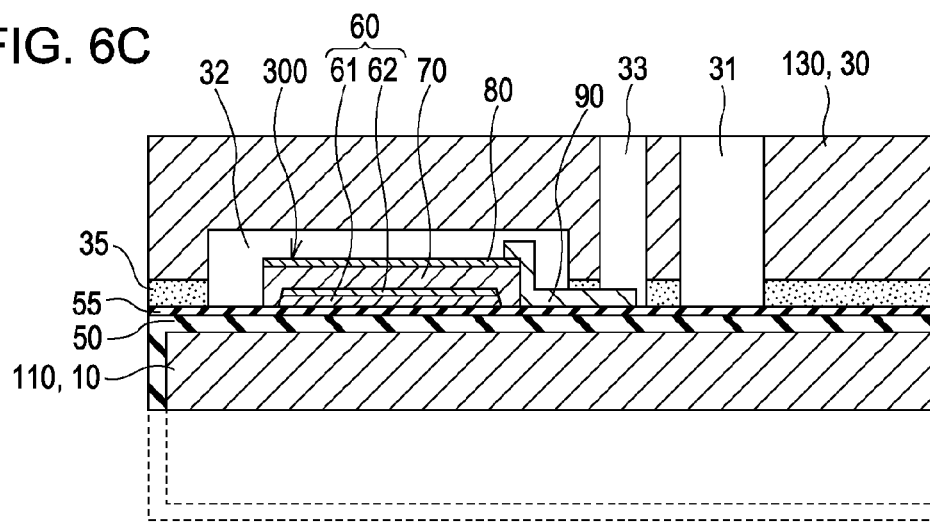

Next, as shown in FIG. 6C, a wafer 130 for the protective substrate which is a silicon wafer and is to be a plurality of the protective substrates 30 is bonded via the adhesive 35 on the side of the piezoelectric element 300 of the wafer 110 for the flow path forming substrate, and thereafter, the wafer 110 for the flow path forming substrate is made thin to have a predetermined thickness.

Next, although not shown in the drawing, a mask film is newly formed on the wafer 110 for the flow path forming substrate and patterned into a predetermined shape. The wafer 110 for the flow path forming substrate is subjected to anisotropic etching (wet etching) using an alkali solution such as KOH via the mask film, thereby forming the pressure generating chamber 12 corresponding to the piezoelectric element 300, the communicating portion 13, the ink supply path 14, the communicating path 15, and the like.

Thereafter, unnecessary parts of the outer peripheral edge portions of the wafer 110 for the flow path forming substrate and the wafer 130 for the protective substrate are removed by, for example, cutting away by dicing. In addition, after removing the mask film on the surface of the wafer 110 for the flow path forming substrate on the opposite side to the wafer 130 for the protective substrate, the nozzle plate 20 having the nozzle openings 21 bored therethrough is bonded, the compliance substrate 40 is bonded to the wafer 130 for the protective substrate, and the wafer 110 for the flow path forming substrate and the like are divided into the flow path forming substrates 10 having a single chip size as shown in FIG. 1, thereby constituting the ink jet recording head I according to this embodiment.

In this embodiment, when the piezoelectric layer 70 is formed above the lanthanum nickelate layer 62 formed using the lanthanum nickelate film forming composition, it is possible to form the piezoelectric layer 70 which is preferentially oriented to the (100) plane at a low cost without using a single-crystal substrate or a seed layer. In addition, since the lanthanum nickelate film forming composition used in this embodiment is stable in the air, it is not necessary to strictly manage the environment in the manufacturing process. When the piezoelectric layer 70 is formed on the lanthanum nickelate layer 62 formed through the chemical solution deposition method using a predetermined lanthanum nickelate film forming composition, it is possible to make the piezoelectric element 300 having an excellent voltage endurance property. In addition, it is possible to make the piezoelectric layer 70 in which the half-width (θ) of a peak derived from the (100) plane measured using the X-ray rocking curve method is 6.0 degrees or less.

Hereinafter, the invention will be described in more detail according to Examples. The invention is not limited to the following Examples.

Example 1

Lanthanum Nickelate Film Forming Composition

First, lanthanum acetate (lanthanum acetate 1.5-hydrate ($La(CH_3COO)_3 \cdot 1.5H_2O$)) and nickel acetate (nickel acetate 4-hydrate ($Ni(CH_3COO)_2 \cdot 4H_2O$)) were added to a beaker so that there was 0.005 mol of each of lanthanum and nickel. Thereafter, 25 ml of an acetic acid aqueous solution (acetic acid: 99.7% by mass) was added thereto and 5 ml of water was further added thereto and mixed therewith. Thereafter, the mixture was heated using a hot plate to increase the solution temperature to about 70° C., and stirred for about 1 hour, thereby manufacturing a lanthanum nickelate film forming composition.

Piezoelectric Element

First, a silicon dioxide film was formed on the surface of a silicon substrate by thermal oxidation. Next, a zirconium film was produced on the silicon dioxide film using a sputtering method and thermal oxidation was performed, thereby forming a zirconium oxide film. Next, (111)-oriented platinum was laminated with a thickness of 150 nm on the zirconium oxide film, thereby forming a wiring layer.

Next, a lanthanum nickelate layer was formed on the wiring layer. Specifically, the substrate was rotated at 2200 rpm and the above-described lanthanum nickelate film forming composition (precursor solution) was added dropwise on the substrate having the titanium oxide film and the platinum film formed thereon, thereby forming a lanthanum nickelate precursor film (application process). Next, the lanthanum nickelate precursor film was heated at 180° C. for 5 minutes (drying process) and heated at 380° C. for 5 minutes (degreasing process). Thereafter, baking was performed at 750° C. for 5 minutes in an oxygen atmosphere, thereby forming a lanthanum nickelate layer having a thickness of about 40 nm. The heating in the drying process, the degreasing process, and the baking process was performed by directly placing the substrate on the hot plate.

Next, a piezoelectric layer 70 was formed on the lanthanum nickelate layer. Specifically, first, a precursor solution was obtained by mixing lead acetate 3-hydrate ($Pb(CH_3COO)_2 \cdot 3H_2O$)), titanium isopropoxide ($Ti[OCH(CH_3)_2]_4$), and zirconium acetylacetonate ($Zr(CH_3COCHCOCH_3)_4$) as main components, butyl cellosolve ($C_6H_{14}O_6$) as a solvent, diethanolamine ($C_4H_{11}NO_2$) as a stabilizer, and polyethylene glycol ($C_2H_6O_6$) as a thickener. The mixing ratio of the precursor solution was as follows: lead acetate 3-hydrate:titanium isopropoxide:zirconium acetylacetonate:butyl cellosolve:diethanolamine:polyethylene glycol=1.1:0.44:0.56:3:0.65:0.5 (molar ratio). 10% excess lead acetate 3-hydrate was added in consideration of loss due to evaporation.

Next, the substrate was rotated at 1200 rpm and the above-described precursor solution was added dropwise for 30 seconds on a first electrode 60, thereby forming a piezoelectric precursor film 71 (application process). Next, the piezoelectric precursor film 71 was heated at 160° C. for 5 minutes (drying process) and heated at 380° C. for 5 minutes (degreasing process). Then, baking was performed at 750° C. for 5 minutes to crystallize the piezoelectric precursor film 71, thereby forming the piezoelectric layer 70 which is made of lead zirconate titanate with a thickness of 1200 nm and has a perovskite structure (baking process). The heating in the drying process, the degreasing process, and the baking process was performed by directly placing the substrate on the hot plate.

Thereafter, a platinum film having a thickness of 30 nm was formed as a second electrode on the piezoelectric layer using a sputtering method, thereby forming a piezoelectric element.

Example 2

A piezoelectric element was formed in the same manner as in Example 1.

Comparative Example 1

A piezoelectric element was formed in the same manner as in Example 1, except that the lanthanum nickelate layer was formed using a sputtering apparatus. The sputtering apparatus formed the lanthanum nickelate layer after setting a substrate temperature to 250 degrees, a film forming pressure to 1.2 Pa, and a sputtering output to 1 kW.

Comparative Example 2

A piezoelectric element was formed in the same manner as in Example 1, except that a buffer layer made of titanium was provided in place of the lanthanum nickelate layer as in JP-A-2008-28030.

Comparative Example 3

A piezoelectric element was formed in the same manner as in Example 1, except that the lanthanum nickelate layer was formed using the following lanthanum nickelate film forming composition, the drying process was not performed, and the degreasing process was performed at 330° C. for 5 minutes.

First, lanthanum acetate (lanthanum acetate 1.5-hydrate ($La(CH_3COO)_3 \cdot 1.5H_2O$)) and nickel acetate (nickel acetate 4-hydrate ($Ni(CH_3COO)_2 \cdot 4H_2O$)) were added to a beaker in the air so that there was 5 mmol of each of lanthanum and nickel. Thereafter, 20 ml of propionic acid (concentration: 99.0% by weight) was added. Thereafter, the mixture was heated using a hot plate to increase the solution temperature to about 140° C., and stirred for about 1 hour, thereby manufacturing a lanthanum nickelate film forming composition which contains lanthanum propionate and nickel propionate and has a metal concentration of 0.5 mol/L. During the heating, the propionic acid was added dropwise at the right time and adjusted so that complete vaporization of the propionic acid was prevented to prevent heating a vessel with no water in it, and finally, the concentration after cooling corresponded to the above-described mixing ratio.

Test Example 1

Figure 7:
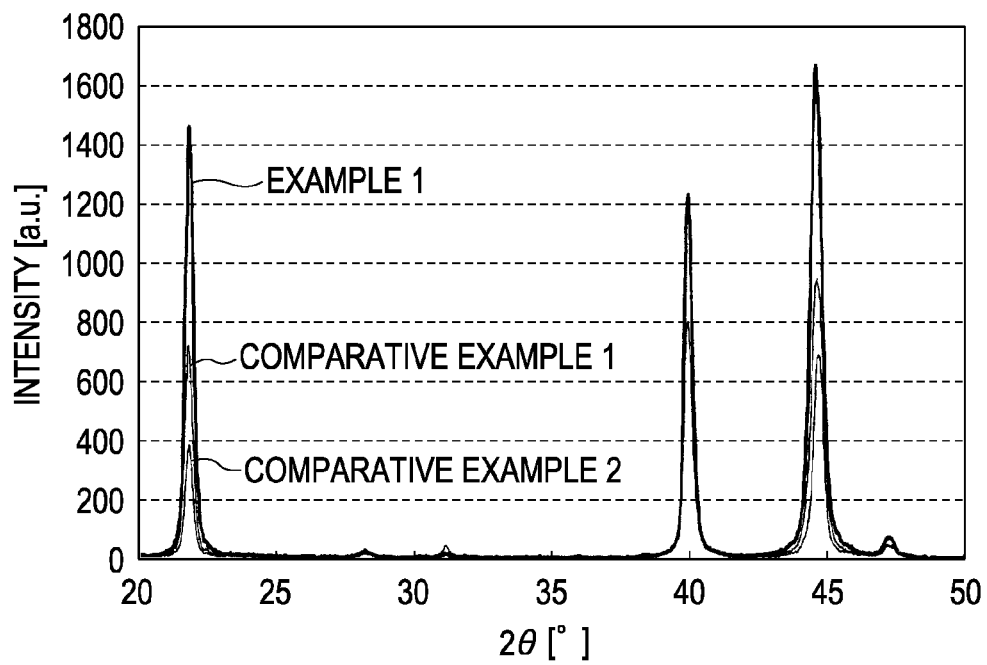
FIG. 7 is a graph illustrating XRD measurement results of Example 1 and Comparative Examples 1 and 2.

X-ray diffraction charts of Examples and Comparative Examples before forming a second electrode were obtained using a "D8 Discover With GADDS; micro area X-ray diffractometer" manufactured by Bruker AXS and using CuKα-rays as an X-ray source at room temperature. As an example of the results, an X-ray diffraction pattern which is a drawing showing the correlationships of diffraction intensity-diffraction angle 2θ of Example 1 and Comparative Examples 1 and 2 is shown in FIG. 7.

As a result, it was confirmed that a perovskite structure ($ABO_3$ structure) was formed in all of the piezoelectric layers of Examples 1 and 2 and Comparative Examples 1 to 3. In addition, it was also confirmed that all of the piezoelectric layers of Examples 1 and 2 and Comparative Examples 1 to 3 were preferentially oriented to a (100) plane.

In addition, X-ray rocking curves of the piezoelectric layers of Examples and Comparative Examples before forming a second electrode were obtained by performing Chi-direction scanning at room temperature using the above-described X-ray diffractometer and using CuKα-rays as an X-ray source. Specifically, θ-2θ measurement and rocking curve measurement were performed. Regarding the integration range of the θ-2θ measurement, for example, 2θ was set to 20° to 50° and ψ_Psi was set to −85° to −95°, and regarding the integration range of the rocking curve measurement, for example, 2θ was set to 20.5° to 23° and χ_Kai was set to −60° to −120°.

Figure 8:
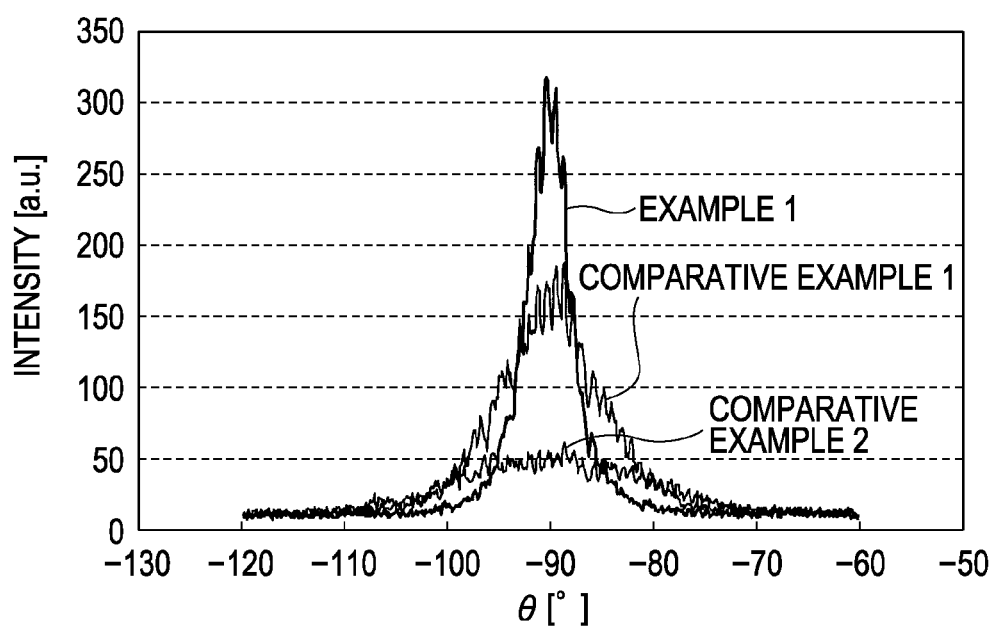
FIG. 8 is a graph illustrating peaks, derived from (100) planes measured using an X-ray rocking curve method, of Example 1 and Comparative Examples 1 and 2.

As an example of the results, the peaks, derived from the (100) planes measured using the X-ray rocking curve method, of Example 1 and Comparative Examples 1 and 2 are shown in FIG. 8. In addition, the results of the half-widths (θ) (FWHM: Full Width at Half Maximum) of the peaks, derived from the (100) planes measured using the X-ray rocking curve method, of Examples and Comparative Examples are shown in Table 1.

TABLE 1

|  | Half-Width (θ) of Peak Derived from (100) Plane |
|---|---|
| Example 1 | 5.12 |
| Example 2 | 5.21 |
| Comparative Example 1 | 13.14 |
| Comparative Example 2 | 20.30 |
| Comparative Example 3 | 10.86 |

As shown in FIG. 8 and Table 1, the half-width of the piezoelectric layer of Comparative Example 2 in which titanium was provided as an orientation control layer was 20.30. In the case of Comparative Example 1 in which the lanthanum nickelate layer was formed using the sputtering method, although the half-width was lower than that in the case of Comparative Example 2, it was still large, that is, 13.14.

On the other hand, in the cases of the piezoelectric layers of Examples 1 and 2, the half-widths of the peaks derived from the (100) planes were very small, that is, 5.12 and 5.21, respectively.

As above, all of the piezoelectric layers of Examples and Comparative Examples were preferentially oriented to the (100) plane, but it was confirmed that the piezoelectric layers of Examples 1 and 2 had a particularly high orientation ratio. In other words, the piezoelectric layers of Examples 1 and 2 were significantly improved in orientation as compared to Comparative Examples 1 to 3.

Test Example 2

Figure 9:
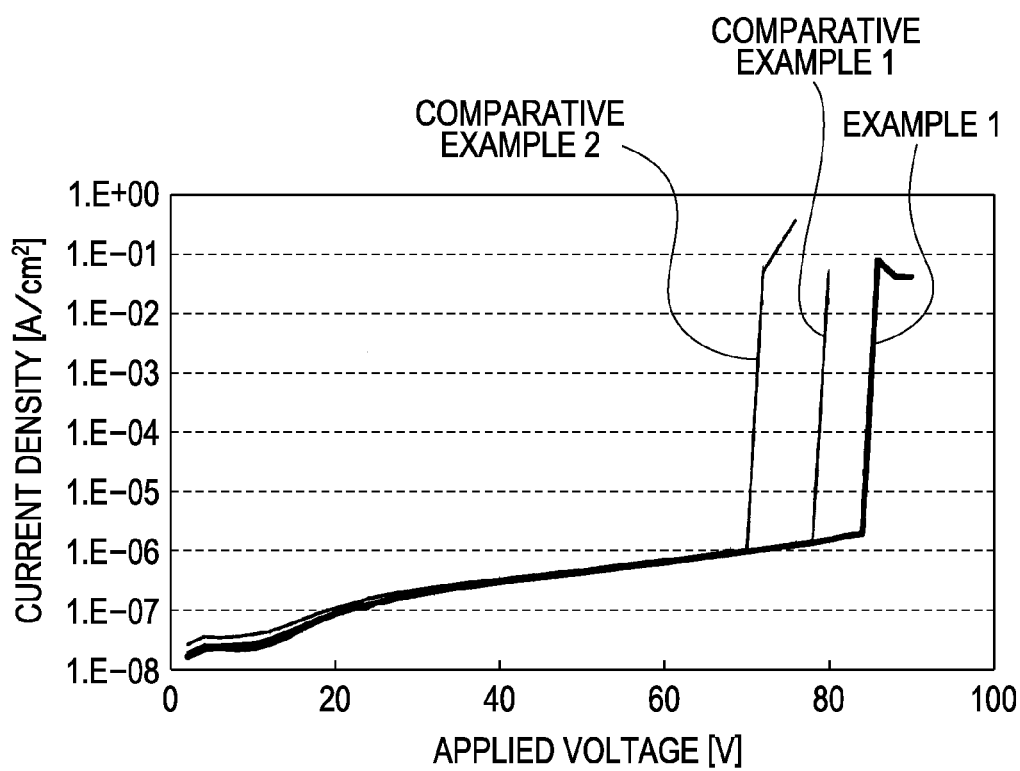
FIG. 9 is a diagram illustrating the relationship between an applied voltage and a current density of Example 1 and Comparative Examples 1 and 2.

Regarding the piezoelectric elements of Example 1 and Comparative Examples 1 to 3, the relationship between the applied voltage and the current density was measured at room temperature using "4140B" manufactured by Hewlett-Packard. The results are shown in FIG. 9. In addition, a voltage (hereinafter, also referred to as the limit voltage) at which dielectric breakdown of the piezoelectric element had occurred was measured. The results are shown in Table 2.

TABLE 2

|  | Limit Voltage (V) |
|---|---|
| Example 1 | 84 |
| Comparative Example 1 | 78 |
| Comparative Example 2 | 70 |
| Comparative Example 3 | 80 |

As shown in FIG. 9 and Table 2, the limit voltage of Example 1 was higher than those of Comparative Example 1 in which the lanthanum nickelate layer was provided using the sputtering method, Comparative Example 2 in which no lanthanum nickelate layer was provided, and Comparative Example 3 in which the lanthanum nickelate layer was formed using another lanthanum nickelate film forming composition. Accordingly, it was confirmed that Example 1 was excellent in voltage endurance property.

Other Embodiments

Although one embodiment of the invention has been described as above, the invention is not limited to the above description. For example, in Embodiment 1, the first electrode 60 is provided with the wiring layer 61, but the wiring layer 61 may not be provided.

In addition, the single-crystal silicon substrate has been exemplified as the flow path forming substrate 10. However, the invention is not particularly limited thereto, and for example, a material such as an SOI substrate or glass may be used.

Figure 10:
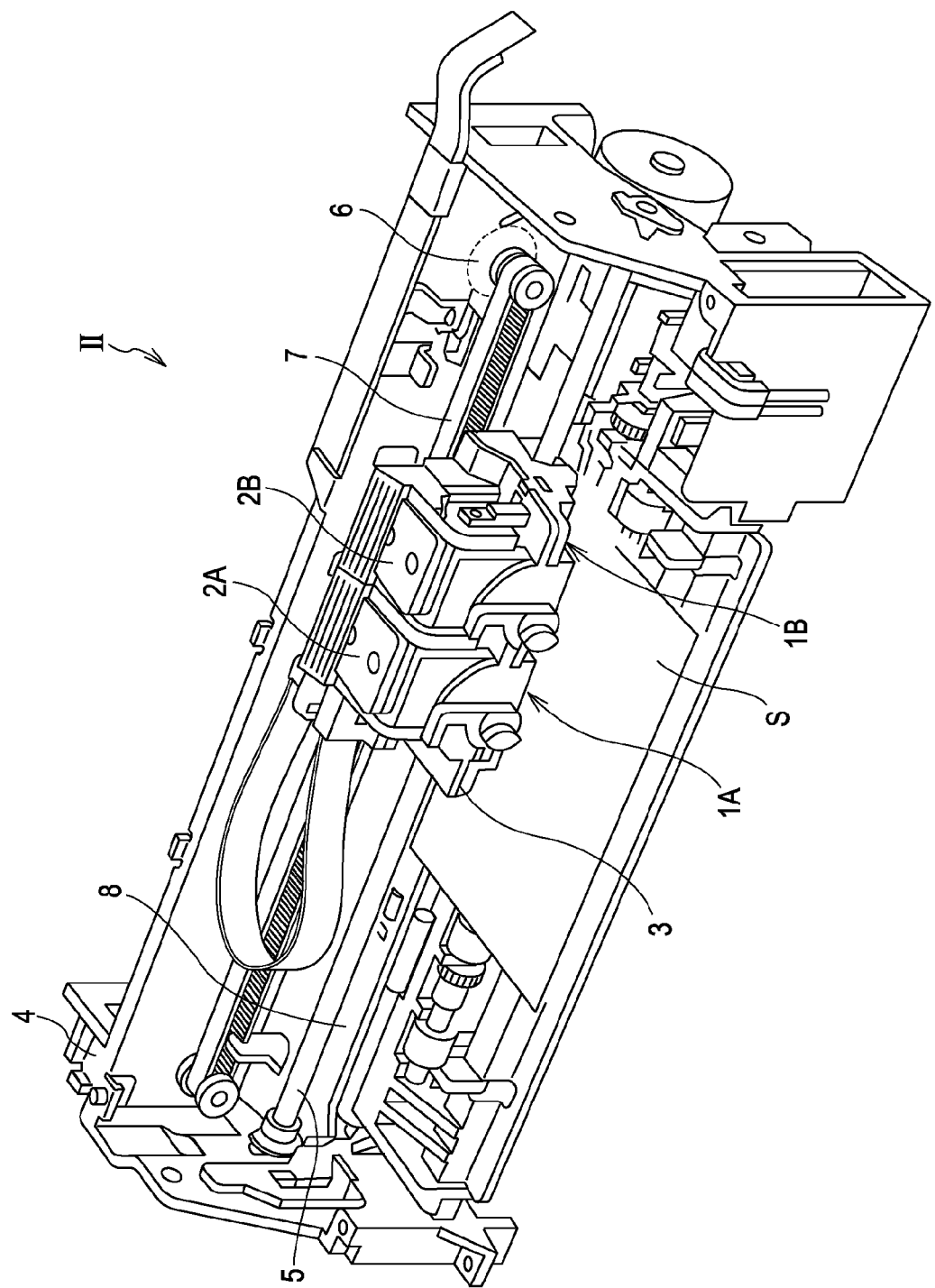
FIG. 10 is a diagram schematically illustrating the configuration of a recording apparatus according to an embodiment of the invention.

The ink jet recording head of these embodiments constitutes a part of a recording head unit which is provided with an ink flow path communicating with an ink cartridge or the like, and is mounted on an ink jet recording apparatus. FIG. 10 is a schematic diagram illustrating an example of the ink jet recording apparatus.

In an ink jet recording apparatus II shown in FIG. 10, cartridges 2A and 2B which are used to constitute an ink supplier are detachably provided in recording head units 1A and 1B having the ink jet recording head I, and a carriage 3 on which the recording head units 1A and 1B are mounted is provided on a carriage shaft 5 attached to an apparatus body 4 so as to freely move in the axial direction. The recording head units 1A and 1B respectively discharge, for example, a black ink composition and a color ink composition.

In addition, a driving force of a driving motor 6 is transmitted to the carriage 3 via a plurality of gears (not shown) and a timing belt 7, and thus the carriage 3 on which the recording head units 1A and 1B are mounted is moved along the carriage shaft 5. A platen 8 is provided in the apparatus body 4 along the carriage shaft 5, and a recording sheet S which is a recording medium such as paper fed from a feeding roller (not shown) or the like is wound around the platen 8 and transported.

In the above-described embodiments, the ink jet recording head has been described as an example of a liquid ejecting head. However, the invention is widely applied to general liquid ejecting heads, and can also be applied to liquid ejecting heads which eject a liquid other than ink. Examples of other liquid ejecting heads include various recording heads which are used in an image recording apparatus such as a printer, color material ejecting heads which are used for manufacturing of a color filter of a liquid crystal display or the like, electrode material ejecting heads which are used for formation of an electrode of an organic EL display, a field emission display (FED), or the like, and biological organic material ejecting heads which are used for manufacturing of biochips.

In addition, the invention is not limited to the piezoelectric element which is used in a liquid ejecting head, and can also be used for other devices, e.g., ultrasonic devices such as ultrasonic transmitters, ultrasonic motors, temperature-electricity converters, pressure-electricity converters, ferroelectric transistors, piezoelectric transformers, and filters such as blocking filters for harmful rays such as infrared rays, optical filters using a photonic crystal effect due to the formation of quantum dots, and optical filters using optical interference of a thin film. In addition, the invention can also be applied to piezoelectric elements which are used as sensors and piezoelectric elements which are used as ferroelectric memories. Examples of the sensor in which the piezoelectric element is used include infrared sensors, ultrasonic sensors, heat-sensitive sensors, pressure sensors, pyroelectric sensors, and gyro sensors (angular velocity sensors).

What is claimed is:

1. A liquid ejecting head comprising:
   a piezoelectric element which is provided with a piezoelectric layer and an electrode provided on the piezoelectric layer, wherein the piezoelectric layer is provided above a lanthanum nickelate film, and is formed of a complex oxide having a perovskite structure which contains at least Pb, Ti, and Zr, and a half-width (θ) of a peak derived from a (100) plane and/or a peak derived from a (001) plane measured using an X-ray rocking curve method is 6.0 degrees or less.

2. A liquid ejecting apparatus comprising:
the liquid ejecting head according to claim 1.

3. A piezoelectric element comprising:
a piezoelectric layer; and
an electrode which is provided on the piezoelectric layer,
wherein the piezoelectric layer is provided above a lanthanum nickelate film, and is formed of a complex oxide having a perovskite structure which contains at least Pb, Ti, and Zr, and a half-width (θ) of a peak derived from a (100) plane and/or a peak derived from a (001) plane measured using an X-ray rocking curve method is 6.0 degrees or less.

4. The piezoelectric element according to claim 3, wherein the lanthanum nickelate layer is formed using a chemical solution deposition method.

5. The piezoelectric element according to claim 4, wherein the chemical solution deposition method includes dissolving lanthanum acetate and nickel acetate in an acetic acid aqueous solution in which acetic acid and water are mixed.

* * * * *